United States Patent
Binti Abdullah et al.

(10) Patent No.: US 10,461,004 B2
(45) Date of Patent: Oct. 29, 2019

(54) INTEGRATED CIRCUIT SUBSTRATE AND METHOD OF PRODUCING THEREOF

(71) Applicant: QDOS Flexcircuits Sdn Bhd, Bayan Lepas (MY)

(72) Inventors: Zalina Binti Abdullah, Bayan Lepas (MY); Roslan Bin Ahmad, Bayan Lepas (MY); Poh Cheng Ang, Bayan Lepas (MY); Poh Choon Whong, Bayan Lepas (MY); Hai San Tew, Bayan Lepas (MY); Shin Hung Hwang, Bayan Lepas (MY); Chee Can Lee, Bayan Lepas (MY); Tiyagarajan S/O Arumugham, Bayan Lepas (MY)

(73) Assignee: QDOS FLEXCIRCUITS SDN BHD, Bayan Lepas (MY)

( * ) Notice: Subject to any disclaimer, the term of this patent is extended or adjusted under 35 U.S.C. 154(b) by 0 days.

(21) Appl. No.: 15/827,677

(22) Filed: Nov. 30, 2017

(65) Prior Publication Data
US 2018/0151462 A1 May 31, 2018

(30) Foreign Application Priority Data
Nov. 30, 2016 (MY) .............................. 2016704448

(51) Int. Cl.
| H01L 23/48 | (2006.01) |
| H01L 23/28 | (2006.01) |
| H01L 23/532 | (2006.01) |
| H01L 23/498 | (2006.01) |
| H01L 21/683 | (2006.01) |

(52) U.S. Cl.
CPC .......... *H01L 23/28* (2013.01); *H01L 21/6835* (2013.01); *H01L 23/498* (2013.01); *H01L 23/53233* (2013.01); *H01L 23/53247* (2013.01); *H01L 23/53276* (2013.01); *H01L 2221/68345* (2013.01)

(58) Field of Classification Search
CPC . H01L 23/28; H01L 23/498; H01L 23/53233; H01L 23/53247; H01L 23/53276; H01L 21/563; H01L 21/6835
USPC ...................................................... 257/741
See application file for complete search history.

(56) References Cited

U.S. PATENT DOCUMENTS 7,795,071 B2    9/2010  Hwee-Seng Jimmy et al.
2014/0083757 A1*  3/2014  Hu ..................... H05K 3/4602
                                                                    174/262

\* cited by examiner

*Primary Examiner* — Tu-Tu V Ho
(74) *Attorney, Agent, or Firm* — Preston Smirman; Smirman IP Law, PLLC (57) ABSTRACT

An integrated circuit substrate and its method of production are described. The integrated circuit substrate comprises at least an internal conductive trace layer formed by one or more internal conductive traces that is deposited on a partially or completely removable carrier; and a dielectric layer encapsulating the internal conductive trace layer through a lamination process or a printing process. The top surface of the topmost internal conductive trace layer and bottom surface of the bottommost internal conductive trace layer are exposed and not covered by the dielectric layer. External conductive trace layer can also be deposited outside of the dielectric layer. The internal conductive trace layers are deposited through plating or printing of an electronically conductive material, whereas the external conductive trace layer is deposited through electroless and electroplating, or printing of the electronically conductive layer.

4 Claims, 7 Drawing Sheets

INTEGRATED CIRCUIT SUBSTRATE AND METHOD OF PRODUCING THEREOF

CROSS-REFERENCE TO RELATED APPLICATION

The instant application claims priority to Malaysia Patent Application Ser. No. PI 2016704448 filed Nov. 30, 2016, the entire specification of which is expressly incorporated herein by reference.

FIELD OF THE INVENTION

The present invention relates generally to the semiconductor field, and more particularly, relates to a substrate of an integrated circuit package and method of making same.

BACKGROUND OF THE INVENTION

In order to address the high demands of electronic packaging from the rapidly growing telecommunication, electrical, automotive, aerospace and defense industries, a variety of integrated circuit packages have been developed to meet a diverse range of application requirements from these industries. The integrated circuit package serves to encapsulate the integrated circuit die and connects onto a printed circuit board through a substrate which is a part of the integrated circuit package that is interposed between the integrated circuit die and the printed circuit board.

U.S. Pat. No. 7,795,071 describes a semiconductor package for fine pitch miniaturization and its manufacturing method. The method involves the formation of a plurality of electronically isolated package trace layout units that is formed by a first patterned conductive layer and a second patterned conductive layer on a carrier. The second bottom surface of the second patterned conductive layer is disposed on the first top surface of the first patterned conductive layer. A mold forms an insulating layer for encapsulating the first and second patterned conductive layers.

However, U.S. Pat. No. 7,795,071 utilizes a molding technology to encapsulate the conductive layers that requires insulating materials to be infused or injected to form the mold.

SUMMARY OF THE INVENTION

The present invention disclosed herein introduces an integrated circuit substrate that eliminates the application of molding technology by introducing a lamination method for encapsulating the conductive layers. Also, the present invention discloses methods for printing conductive layers on the substrate.

An aspect of this invention is to provide an integrated circuit substrate that adopts a lamination or a printing method for encapsulating the conductive layers using a dielectric layer.

Another aspect of this invention is to provide an integrated circuit substrate that allows complete or partial removal of the carrier.

Still another aspect of this invention is to provide an integrated circuit substrate that has a very thin dielectric layer for encapsulating the conductive layer, and is strong enough to support the substrate with or without a carrier.

Yet another aspect of this invention is to provide an integrated circuit substrate that enables plating or printing of the conductive trace layers that can be internally deposited within the dielectric layer and externally deposited on the dielectric layer.

Also another aspect of this invention is to provide an integrated circuit substrate that allows two sides of electronic connection by having conductive trace layers on the top surface and bottom surface of the integrated circuit substrate.

At least one of the preceding aspects is met, in whole or in part, by this invention, in which the preferred embodiment of this invention describes an integrated circuit substrate that comprises at least an internal conductive trace layer formed by one or more internal conductive traces that is deposited through plating or printing of an electronically conductive material on a partially or completely removable carrier, and a dielectric layer encapsulating the internal conductive trace layers through a lamination process or a printing process, wherein the dielectric layer has openings to expose at least one top surface of topmost internal conductive trace layer, and optionally expose at least one bottom surface of bottommost internal conductive trace layer when the carrier is partially or completely removed.

In accordance with the aforementioned aspects, this invention also relates to a method for producing an integrated circuit substrate that comprises the steps of creating at least an internal patterned mask layer defined by multiple mask units that are spaced apart by gaps on a partially or completely removable carrier, depositing at least an internal conductive trace layer formed by one or more internal conductive traces into the gaps of each internal patterned mask layer such that each gap is occupied with an internal conductive trace, removing the internal patterned mask layer through a de-masking process, and encapsulating the internal conductive trace layer with a dielectric layer through a lamination process or a printing process, the dielectric layer has openings to expose at least one top surface of topmost internal conductive trace layer, and optionally expose at least one bottom surface of bottommost internal conductive trace layer when the carrier is partially or completely removed, wherein the internal conductive trace layer is deposited through plating or printing of an electronically conductive material.

DETAILED DESCRIPTION OF THE INVENTION

For a better understanding of the invention, preferred embodiments of the invention that are illustrated in the accompanying drawings will be described in detail.

This disclosure describes an integrated circuit substrate (100) for producing an extreme fine circuitry to cater a broad range of frequency performance applications, especially applications with low noise, high frequency and mobility requirements. A general embodiment of this invention comprises at least an internal conductive trace layer (104, 106) formed by one or more internal conductive traces, and a dielectric layer (107) encapsulating the internal conductive trace layers (104, 106) with openings exposing the top surfaces of the topmost internal conductive traces for integrated circuit substrates with and without a carrier, and optionally expose the bottom surfaces of the bottommost internal conductive traces for integrated circuit substrates (100) with a partially or completely removed carrier (101). In a situation where there is only one internal conductive trace layer (104), the internal conductive trace layer (104) is both the topmost and bottommost internal conductive trace layer (104), and both the top and bottom surfaces of the internal conductive trace layer (104) is exposed.

In one of the preferred embodiments of the invention where there are more than one internal conductive trace layers (104, 106), the internal conductive trace layers (104, 106) are configured in a manner where the internal conductive trace of an upper internal conductive trace layer (106) is disposed on top of at least an internal conductive trace of a lower internal conductive trace layer (104). The first internal conductive trace layer (104) being the bottommost internal conductive trace layer is disposed on a carrier (101), whereas the second internal conductive trace layer (106) is disposed on top of the first internal conductive trace layer (104).

Figure 15:
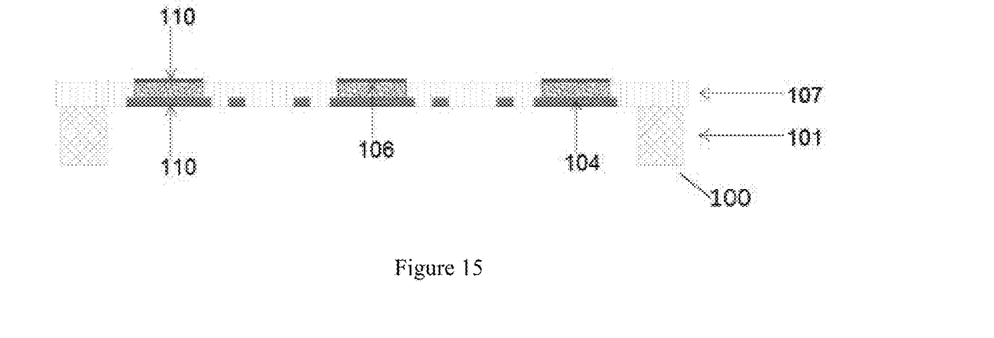
FIG. 15 is a diagram showing the deposition of finishing layers on the exposed internal conductive trace layers for the substrate with a partial carrier and only internal conductive trace layers.
Figure 25:
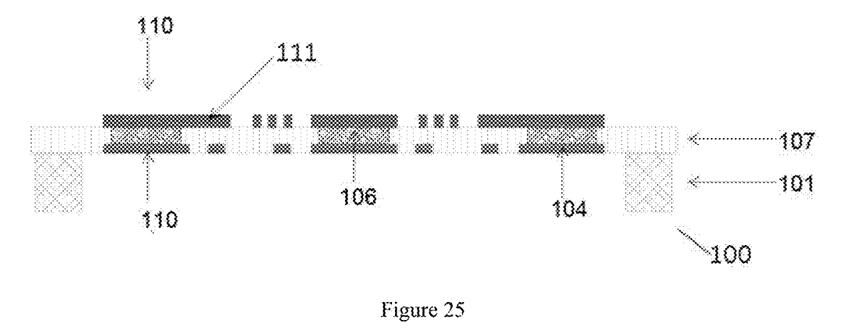
FIG. 25 is a diagram showing the deposition of finishing layers on the exposed external and internal conductive trace layers for the substrate with a partial carrier and with external and internal conductive trace layers.

The carrier (101), which is made of a conductive material and acts as a support for the internal conductive trace layers (104, 106) and a base for the deposition of the first internal conductive trace layer (104), is retainable or removable upon encapsulation by the dielectric layer (107). FIG. 15 and FIG. 25 each shows a complete integrated circuit substrate (100) having a partial carrier (101), whereas FIG. 19 and FIG. 29 each illustrates a complete integrated circuit substrate (100) without any carrier (101). With the carrier (101) partially or completely removed, the bottom portion of the dielectric layer (107) is revealed, thereby exposing the bottom surface of the bottommost internal conductive trace layer (104) defined by the first internal conductive trace layer (104). A finishing layer (110) is formed on the exposed top surface of the topmost internal conductive trace layer (106), and on the bottom surface of the bottommost internal conductive trace layer (104) when the carrier (101) is partially or completely removed.

Figure 2:
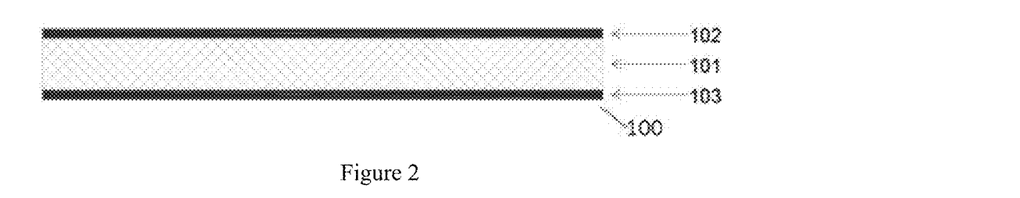
FIG. 2 is a diagram showing the carrier being applied with a top carrier mask layer and a first bottom carrier mask layer.
Figure 4:
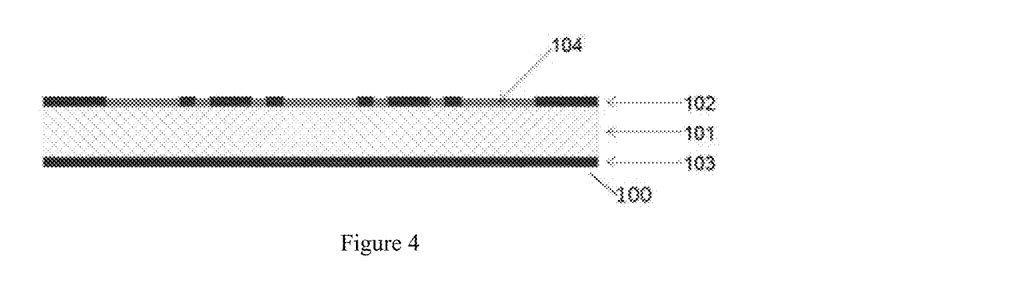
FIG. 4 is a diagram showing the first internal conductive trace layer that is deposited through plating or printing process.
Figure 19:
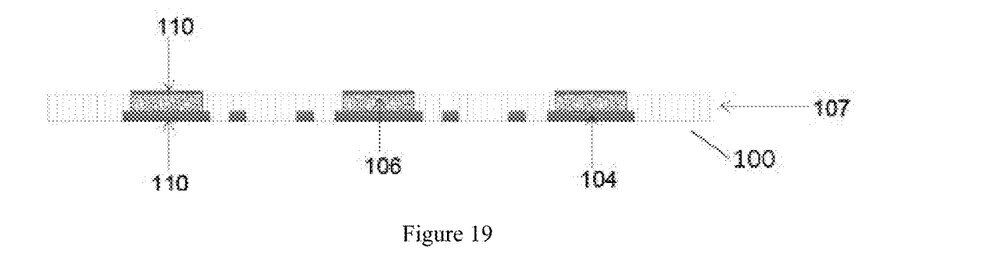
FIG. 19 is a diagram showing the deposition of finishing layers on the exposed internal conductive trace layers for the substrate without a carrier and with only internal conductive trace layers.

While the preferred embodiments depicted in FIG. 15 and FIG. 19 contain only the internal conductive trace layers (104, 106), FIG. 2 and FIG. 4 present other preferred embodiments of the invention that possess at least an external conductive trace layer (111) in addition to the internal conductive trace layers (104, 106). The external conductive trace layer (111) is formed by one or more external conductive traces that is deposited on any one or combination of top surface of the dielectric layer (107), top surface of the exposed topmost internal conductive trace layer, bottom surface of the dielectric layer (107) when the carrier (101) is partially or completely removed, and bottom surface of the exposed bottommost internal conductive trace layer when the carrier (101) is partially or completely removed. In the embodiments of the present invention shown in FIGS. 2 and 4, the external conductive traces are distributed on the dielectric layer (107) where the exposed surfaces of the topmost internal conductive traces are connected to some of the external conductive traces. There are also some external conductive traces that are not connected to any of the internal conductive traces. The top surfaces of the topmost external conductive trace layer, and the bottom surface of the bottommost external conductive trace layers are deposited with a finishing layer (110). In the preferred embodiments of the invention shown in FIG. 15, FIG. 19, FIG. 25 and FIG. 29, there is no external conductive trace layers on the bottom part of substrate. Thus, the finishing layer (110) is only applied on the topmost external conductive trace layer (111) and the bottommost internal conductive trace layer (104).

Besides of the structure and configuration of the integrated circuit substrate (100), the present invention also discloses the method of producing the integrated circuit substrate (100). FIG. 1 to FIG. 15 show the steps of creating the integrated circuit substrate (100) with a partial carrier (101) and only with internal conductive trace layers (104, 106). FIG. 1 to FIG. 10 and FIG. 16 to FIG. 20 show the steps of forming the integrated circuit substrate (100) without any carrier (101) and only with internal conductive trace layers (104, 106). On the other hand, FIG. 1 to FIG. 10 and FIG. 20 to FIG. 25 illustrate the steps of producing the integrated circuit substrate (100) with a partial carrier (101) and with both the internal conductive trace layers (104, 106) and external conductive trace layer (111), whereas FIG. 1 to FIG. 10, FIG. 20 and FIG. 26 to FIG. 29 illustrate the steps of creating the integrated circuit substrate (100) without any carrier (101) and with both the internal conductive trace layers (104, 106) and external conductive trace layer (111).

Figure 1:
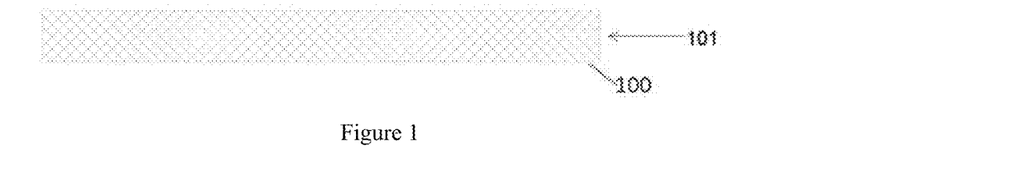
FIG. 1 is a diagram showing a carrier.
Figure 3:
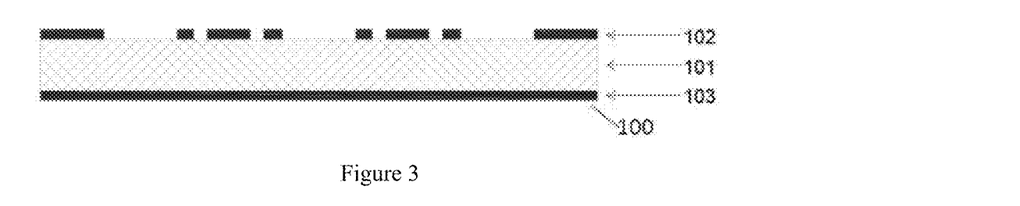
FIG. 3 is a diagram showing the formation of a first internal patterned mask layer from the top carrier mask layer.

As shown in FIGS. 1 and 2, respectively, the process starts with the step of providing a carrier (101) and masking the top and bottom surfaces of the carrier (101) to form a top carrier mask layer (102) and a first bottom carrier mask layer (103) respectively, in which the top carrier mask layer (102) is used to create an internal patterned mask layer (102) on the carrier (101). To avoid unnecessary buildup of conductive trace layers on the bottom of the carrier during deposition of the conductive trace layers, the first bottom carrier mask layer (103) is formed as a protection means for the bottom surface of the carrier. The internal patterned mask layer (102) as illustrated in FIG. 3 is defined by multiple mask units that are spaced apart by gaps on the carrier (101). Next, referring to FIG. 4, an internal conductive trace layer (104) is deposited into the gaps of each internal patterned mask layer (102) through plating or printing of an electronically conductive material such that each gap is occupied with an internal conductive trace. Preferably, the plating process is an electroplating process.

Figure 5:
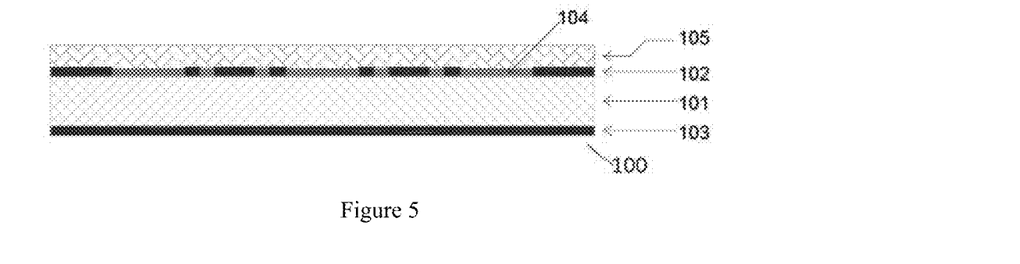
FIG. 5 is a diagram showing the deposition of a second mask layer on top of the first internal patterned mask layer and first internal conductive trace layer.
Figure 6:
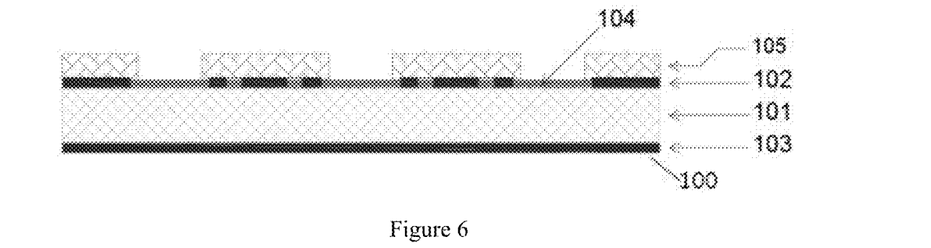
FIG. 6 is a diagram showing the formation of a second internal patterned mask layer from the second mask layer.
Figure 7:
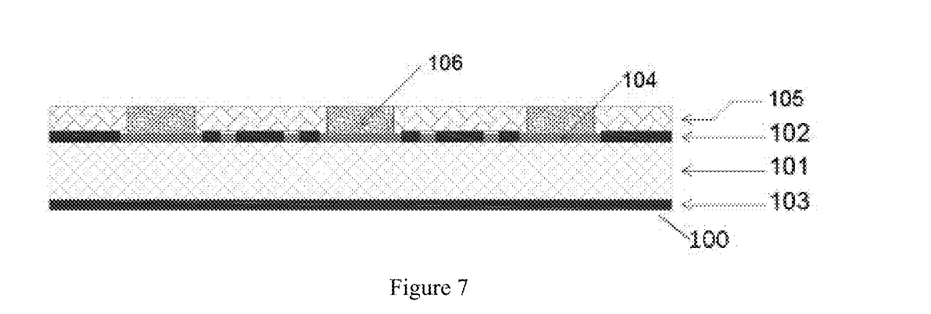
FIG. 7 is a diagram showing the second internal conductive trace layer that is deposited through plating or printing process.

In the preferred embodiments of the invention depicted in FIGS. 7 to 29 where there are more than one internal conductive trace layers (104. 106), a first internal conductive trace layer (104) is deposited into the gaps of a first internal patterned mask layer (102) which is positioned on the carrier (101), and the second internal conductive trace layer (106) is deposited into the gaps of a second internal patterned mask layer (105) that is disposed on the first internal patterned mask (102) and the first internal conductive trace layer (104). Similarly, the electroplating or printing process is performed to deposit the additional internal conductive trace layers (106). FIG. 5 shows the deposition of a second mask layer on top of the first internal patterned mask layer and first internal conductive trace layer, whereas FIG. 6 shows the formation of a second internal patterned mask layer from the second mask layer. FIG. 7 illustrates the deposition of the second internal conductive trace layer.

Figure 8:
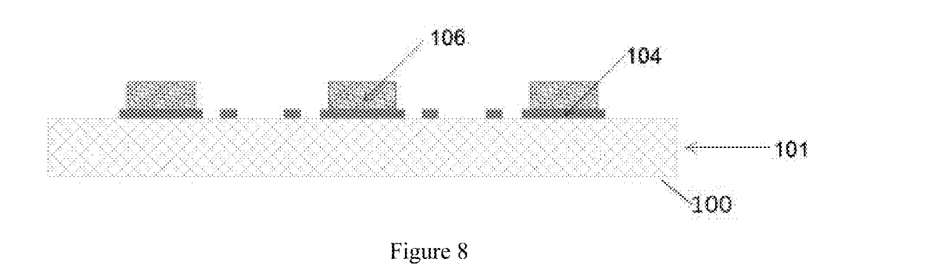
FIG. 8 is a diagram showing the removal of the first and second internal patterned mask layers through a de-masking process.
Figure 9:
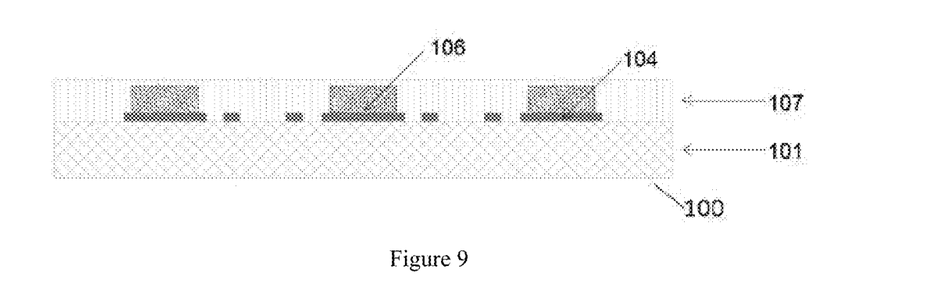
FIG. 9 is a diagram showing the encapsulation of the internal conductive trace layers using a dielectric layer through a lamination process or a printing process.

When deposition of all internal conductive trace layers (104, 106) are completed, the internal patterned mask layers (102, 105) and the first bottom carrier mask layer (103) are removed through a de-masking process as depicted in FIG. 8. A dielectric layer (107) is used to encapsulate or seal the internal conductive trace layers (104, 106) through a lamination process by heat, pressure, welding, or adhesives to form a thin film encapsulant through using a dielectric material (107) in solid form as depicted in FIG. 9. Preferably, vacuum hot press is applied as the lamination method. Optionally, the dielectric layer (107) can also encapsulate the internal conductive trace layers (104, 106) via a printing process whereby a dielectric material in liquid form is utilized to be printed on the internal conductive trace layers (104, 106). Upon printing, the dielectric layer cures and becomes a solid dielectric layer (107) in the form of a thin film encapsulant. The dielectric layer (107) has a thickness of at least 10 micrometers.

Figure 10:
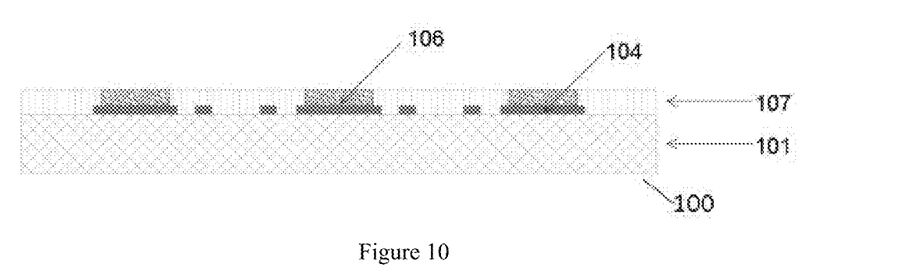
FIG. 10 is a diagram showing a trimmed dielectric layer to expose the topmost internal conductive trace layers.

Excessive portion of the dielectric layer (107) is trimmed such that the top surface of the dielectric layer (107) is at a substantially similar level as the top surface of the topmost internal conductive trace layer (106). Trimming of the excessive portion of the dielectric layer (107) not only reduces thickness of the dielectric layer but also trims away portions of the dielectric layer (107) that are on top of the topmost internal conductive traces, thereby forming openings to expose at least one of the topmost internal conductive traces. FIG. 10 shows a trimmed dielectric layer (107). The bottom surface of the dielectric layer is at a level substantially similar as the bottom surface of the first conductive trace layer (104).

Figure 20:
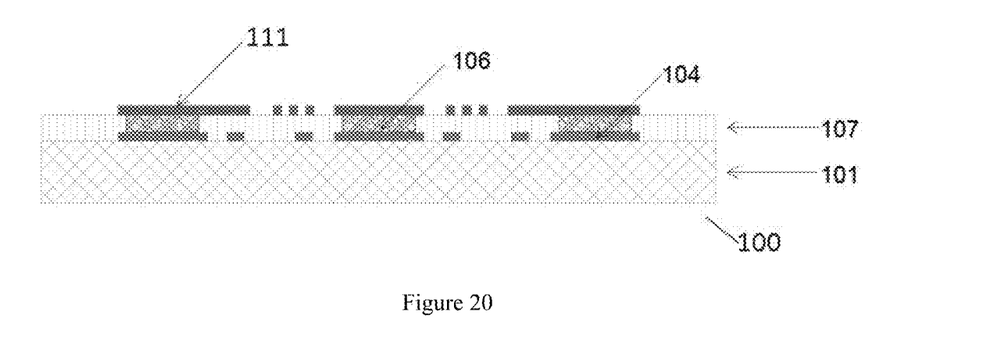
FIG. 20 is a diagram showing the deposition of an external conductive trace layer on top of the dielectric layer and topmost internal conductive trace layer through an electroless and electroplating, or printing process.

In the preferred embodiments of the present invention shown in FIG. 20, at least an external conductive trace layer (111) formed by one or more external conductive traces is deposited outside of the dielectric layer (107) and on at least an of the exposed surfaces of the internal conductive traces through electroless and electroplating, or printing of an electronically conductive material. Optionally, an external patterned mask layer having mask units that are spaced apart by gaps is disposed on the dielectric layer for guiding the external conductive trace to be deposited into the gaps. The external patterned mask layer is removed upon deposition of the external conductive trace layer (111).

The electronically conductive material used in both the external conductive trace layer (111) and internal conductive trace layers (104, 106) is preferred but not limited to copper, silver, carbon metal and their alloys. Since the carrier (101) is a conductive material, electroplating can be done to deposit the first internal conductive trace layer (104). Similarly, as the additional conductive trace layers such as the second conductive trace layer (106) is also a conductive material, electroplating can be applied for the deposition of these additional conductive trace layers. On the other hand, as the dielectric layer (107) is an insulating material, electroless plating is performed on the dielectric layer (107) before conducting the electroplating process to prepare a surface for electroplating the external conductive trace layer (111). The electroless plating process utilizes a redox reaction to deposit the electronically conductive material on the patterned mask layer (102, 105) without the passage of an electric current. The gaps in between the mask units of the patterned mask layer can be plated with ease through electroless plating as it deposits the electronically conductive material evenly over irregularly shaped objects with a constant metal ion concentration. The electroless plating process also involves the step of desmearing.

On the other hand, the printing process that is preferred but not limited to silk-screen printing process involves the utilization of copper paste, especially the silver coated copper paste. During the silk-screen printing process, the paste is transferred onto the external or internal patterned mask layers (102, 105) and filled the gaps by a squeegee that moves across a screen. The squeegee fills the mesh openings of the screen with the paste when it sweeps across the screen in a stroke. A reverse stroke then brings the screen down onto the surface of the external or internal patterned mask layers (102, 105) momentarily, pushes the paste onto the external or internal pattered mask layers (102, 105) and then pulls the paste out of the mesh openings as the screen springs back after the squeegee has passed. Other than silk-screen printing, vacuum printing is also applicable in the present invention.

Polishing or grinding is conducted to remove unwanted electronically conductive material that is printed on the external or internal pattered mask layers (102, 105) such as those printed on the mask units. Printing allows thickness of the print that is the conductive trace layers (104, 106, 111) to be controlled, thereby enabling thin yet strong conductive trace layers (104, 106, 111) to be deposited. Furthermore, only a small amount of electronically conductive material in paste form, such as copper paste is required to be applied for the printing process. The printing process also simplifies the deposition of the internal and external conductive trace layers (104, 106, 111) as compared to the plating process, thereby reducing the deposition time.

Figure 11:
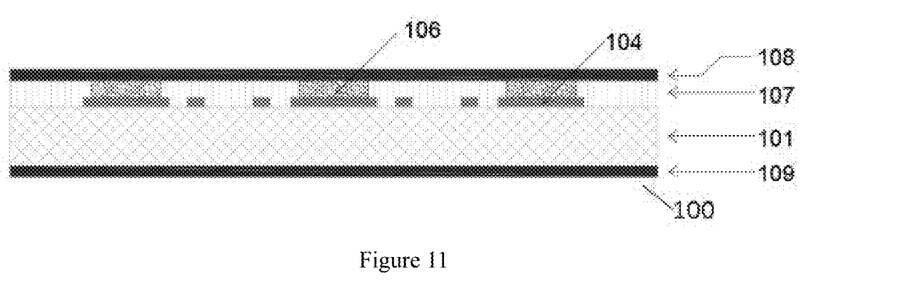
FIG. 11 is a diagram showing the deposition of a top dielectric mask layer and a second bottom mask layer to partially remove the carrier of the substrate with only internal conductive trace layers.
Figure 12:
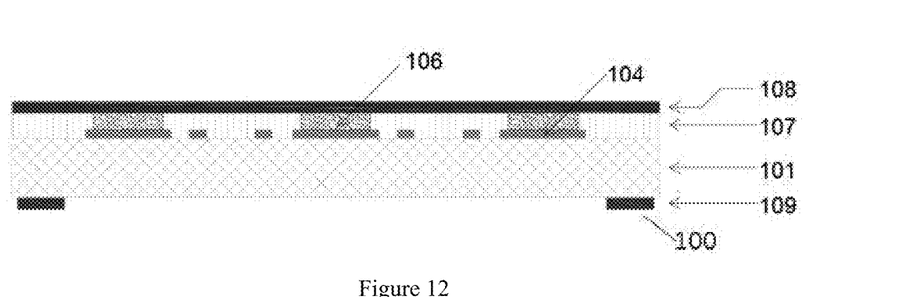
FIG. 12 is a diagram showing the creation of a carrier patterned mask layer from the second bottom mask layer to partially remove the carrier of the substrate with only internal conductive trace layers.
Figure 13:
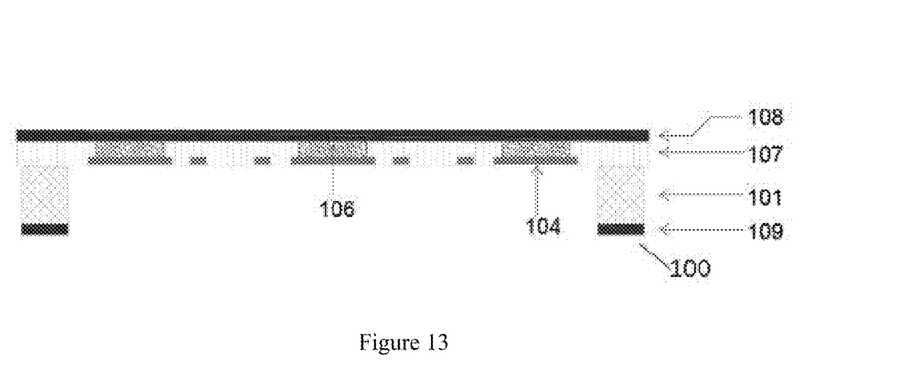
FIG. 13 is a diagram showing the partial removal of the carrier through an etching process for the substrate with only internal conductive trace layers.
Figure 14:
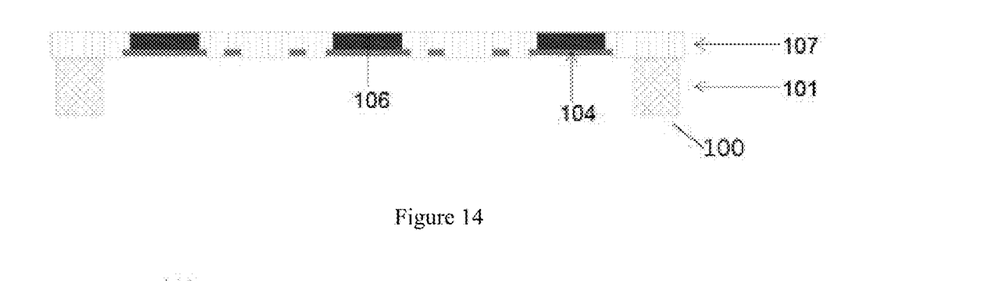
FIG. 14 is a diagram showing the removal of the top dielectric mask layer and the carrier patterned mask layer through a de-masking process for the substrate with only internal conductive trace layers.
Figure 16:
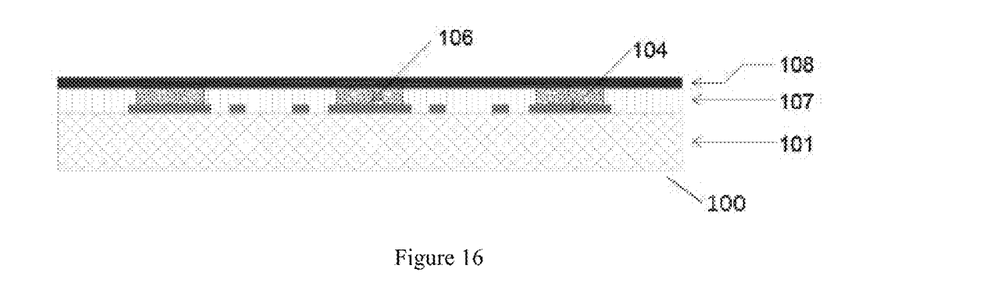
FIG. 16 is a diagram showing the deposition of a top dielectric layer mask layer and without the second bottom mask layer to completely remove the carrier of the substrate with only internal conductive trace layers.
Figure 17:
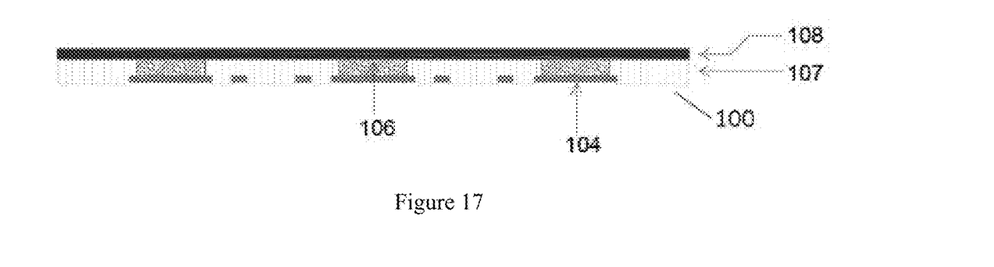
FIG. 17 is a diagram showing the complete removal of the carrier through an etching process for the substrate with only internal conductive trace layers.
Figure 21:
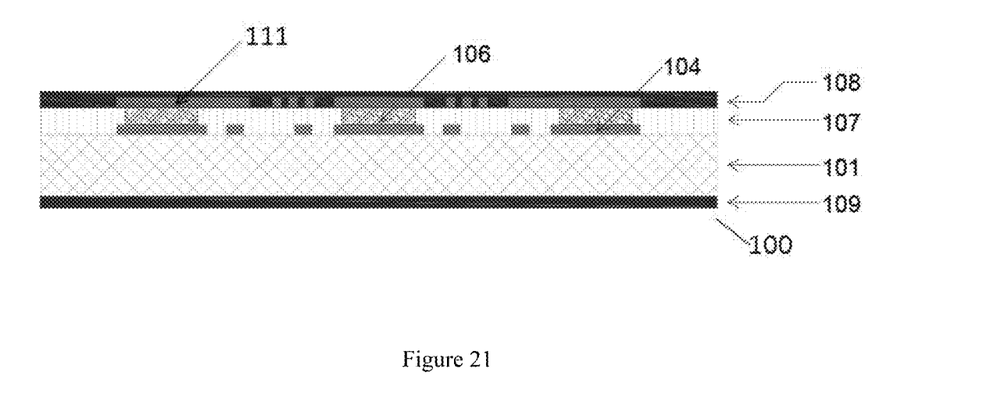
FIG. 21 is a diagram showing the deposition of a top dielectric mask layer and a second bottom mask layer to partially remove the carrier of the substrate with external and internal conductive trace layers.
Figure 22:
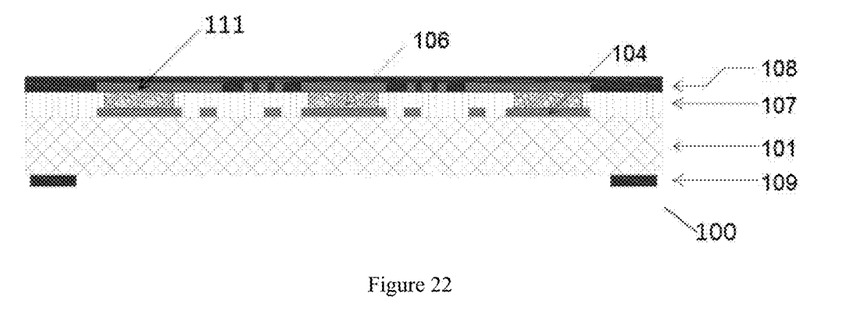
FIG. 22 is a diagram showing the creation of a carrier patterned mask layer from the second bottom mask layer to partially remove the carrier of the substrate with external and internal conductive trace layers.
Figure 23:
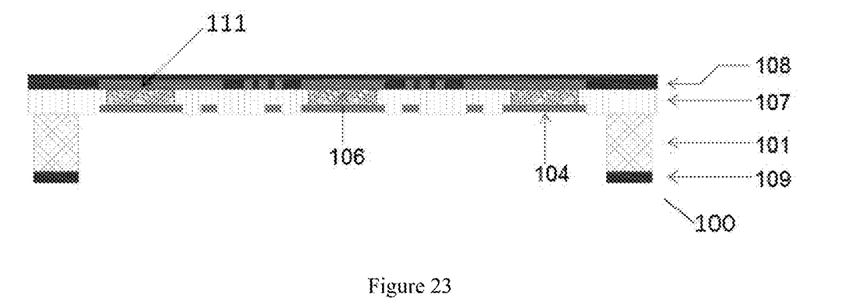
FIG. 23 is a diagram showing the partial removal of the carrier through an etching process for the substrate with external and internal conductive trace layers.
Figure 24:
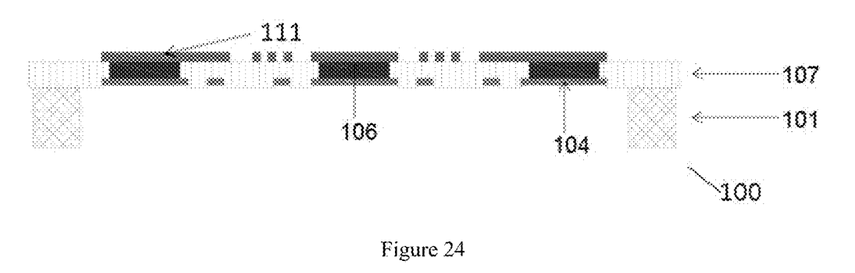
FIG. 24 is a diagram showing the removal of the top dielectric mask layer and the carrier patterned mask layer through a de-masking process for the substrate with a partial carrier and with external and internal conductive trace layers.
Figure 26:
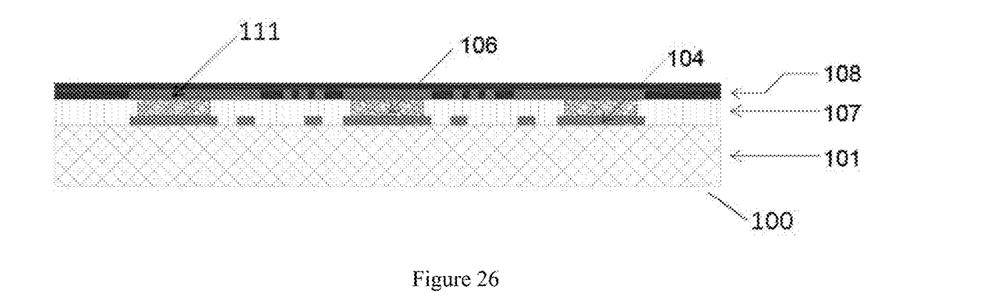
FIG. 26 is a diagram showing the deposition of a top dielectric layer mask layer and without the second bottom mask layer to completely remove the carrier of the substrate with external and internal conductive trace layers.
Figure 27:
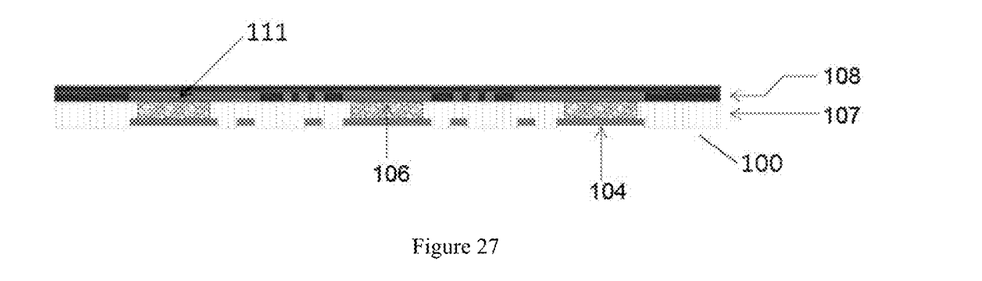
FIG. 27 is a diagram showing the complete removal of the carrier through an etching process for the substrate with external and internal conductive trace layers.

Upon encapsulation of the internal conductive trace layers (104, 106) if the integrated circuit substrate (100) does not contain any external conductive trace layer (111), or after the deposition of the external conductive trace layer (111) if the integrated circuit substrate (100) comprises the external conductive trace layer (111), the top surface of the dielectric layer (107) and the bottom surface of the carrier (101) are masked to form a top dielectric mask layer (108) and a second bottom carrier mask layer (109) as presented in FIG. 11 and FIG. 21. The top dielectric mask layer (108) is formed to protect the top surface of the dielectric layer (107) and the external conductive trace layer (111) whereas the second bottom carrier mask layer (109) is used to form a carrier patterned mask layer (109) defined by spaced apart mask units as presented in FIG. 12 and FIG. 22 respectively to determine the portion of carrier (101) that is to be removed. As depicted in FIG. 13 and FIG. 23, the carrier (101) is partially removed through removing the portion of the carrier (101) without the mask units through an etching process. Upon completion of the etching process, the top dielectric layer mask layer (108) and carrier patterned mask layer (109) are removed through de-masking process as shown in FIG. 14 and FIG. 24. However, as shown in FIG. 16 and FIG. 26, in order to completely remove the carrier (101), only the top dielectric layer mask layer (108) is formed without the need to mask the bottom surface of the carrier (101). Through the etching process illustrated in FIG. 17 and FIG. 27, the carrier (101) is then completely removed.

Figure 18:
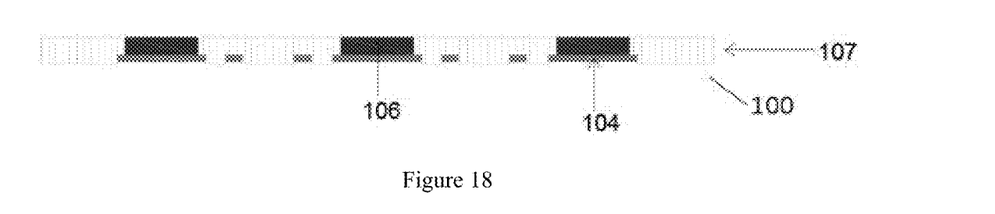
FIG. 18 is a diagram showing the removal of the top dielectric mask layer through a de-masking process for the substrate without a carrier and with only internal conductive trace layers.
Figure 28:
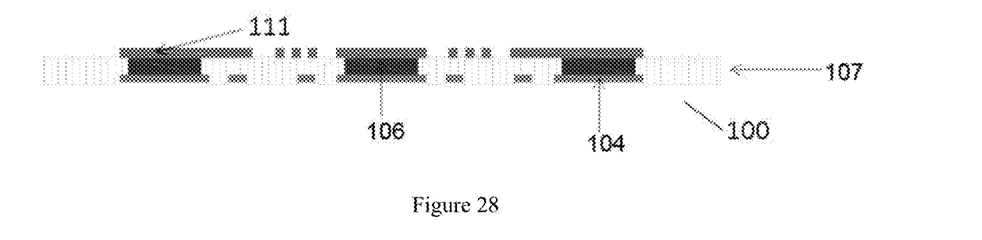
FIG. 28 is a diagram showing the removal of the top dielectric mask layer through a de-masking process for the substrate without a carrier and with external and internal conductive trace layers.

After that, the top dielectric layer mask layer (108) is also removed through the de-masking process depicted in FIG. 18 and FIG. 28. All mask layers (102, 103, 105, 108, 109) applied in this invention are preferably photo-resist materials. Upon partial or complete removal of the carrier (101), the bottommost conductive trace layer that is the first conductive trace layer (104) can be exposed for finishing layer (111) to be formed on its bottom surface, or external conductive trace layer to be deposited on the bottom surface of the dielectric layer (107) and the first conductive trace layer (104).

Figure 29:
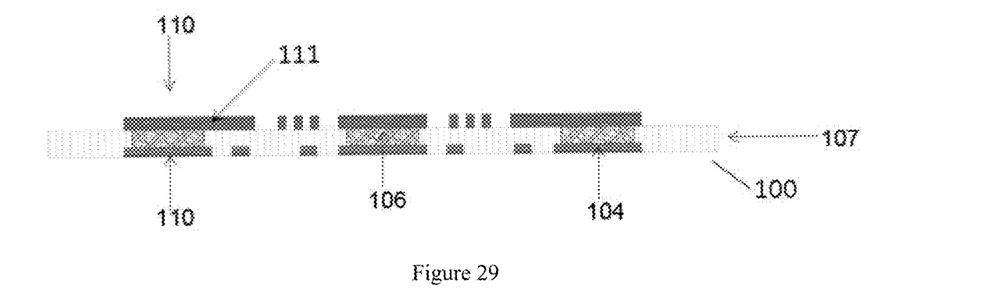
FIG. 29 is a diagram showing the deposition of finishing layers on the exposed external and internal conductive trace layers for the substrate without a carrier and with external and internal conductive trace layers.

With references to FIG. 15 and FIG. 19, the final step of the entire process to produce the integrated circuit substrate (100) without any external conductive trace layer (111) is the deposition of the finishing layer (110) on the exposed top and bottom surfaces of the internal conductive traces (104, 106). On the other hand, for integrated circuit substrates (100) with an external conductive trace layer (111), the exposed surface of the external conductive trace layer (111) that is the top surface of the topmost external conductive trace layer (111), as well as the exposed top and bottom surfaces of the internal conductive traces (104, 106) are added with the finishing layer (110) as shown in FIG. 19 and FIG. 29. These finishing layers (110) can be formed via surface finishing techniques including metal plating and organic solderability preservative process.

What is claimed is:

1. An integrated circuit substrate, comprising:
   at least an internal conductive trace layer formed by one or more internal conductive traces that is deposited through plating or printing of an electronically conductive material on a partially or completely removable carrier; and
   a dielectric layer encapsulating the internal conductive trace layers through a lamination process or printing process;
   wherein the dielectric layer has a first opening to expose at least one top surface of a topmost internal conductive trace layer when the carrier is partially or completely removed;
   wherein the dielectric layer has a second opening to expose at least one bottom surface of a bottommost internal conductive trace layer when the carrier is partially or completely removed;
   a first finishing layer formed on the exposed top surface of the topmost internal conductive trace layer when the carrier is partially or completely removed;
   a second finishing layer formed on the exposed bottom surface of the bottommost internal conductive trace layer when the carrier is partially or completely removed;
   wherein the internal conductive trace layers are configured in a manner where the internal conductive trace of an upper internal conductive trace layer is disposed on top of at least an internal conductive trace of a lower internal conductive trace layer;
   at least an external conductive trace layer formed by one or more external conductive traces on any one or combination of a top surface of the dielectric layer, a top surface of the exposed topmost internal conductive trace layer, a bottom surface of the dielectric layer when the carrier is partially or completely removed, and a bottom surface of the exposed bottommost internal conductive trace layer when the carrier is partially or completely removed;

a third finishing layer formed on a top surface of a topmost external conductive trace layer when the carrier is partially or completely removed; and a fourth finishing layer formed on a bottom surface of a bottommost external conductive trace layer when the carrier is partially or completely removed.

2. The integrated circuit substrate according to claim 1, wherein the electronically conductive material is any one or combination of copper, silver, carbon metal and their alloys.

3. The integrated circuit substrate according to claim 1, wherein the third and fourth finishing layers are a metal or an organic solderability preservative.

4. The integrated circuit substrate according to claim 1, wherein the dielectric layer has a thickness of at least 10 micrometers.

* * * * *